US008298750B2

(12) United States Patent
Levanon et al.

(10) Patent No.: US 8,298,750 B2

(45) Date of Patent: Oct. 30, 2012

(54) POSITIVE-WORKING RADIATION-SENSITIVE IMAGEABLE ELEMENTS

(75) Inventors: Moshe Levanon, Ness-Ziona (IL); Georgy Bylina, Lod (IL); Vladimir Kampel, Sederot (IL); Marina Rubin, Petah-Tikva (IL); Larisa Postel, Ashdod (IL); Tanya Kurtser, Petach Tikva (IL); Moshe Nakash, Ramat Hashron (IL)

(73) Assignee: Eastman Kodak Company, Rochester, NY (US)

( * ) Notice: Subject to any disclaimer, the term of this patent is extended or adjusted under 35 U.S.C. 154(b) by 475 days.

(21) Appl. No.: 12/555,040

(22) Filed: Sep. 8, 2009

(65) Prior Publication Data

US 2011/0059399 A1 Mar. 10, 2011

(51) Int. Cl.
*G03F 7/00* (2006.01)
*G03F 7/26* (2006.01)

(52) U.S. Cl. .................. 430/281.1; 430/270.1; 430/302; 430/329; 101/450.1; 101/453; 101/463.1

(58) Field of Classification Search ............... 430/270.1, 430/302; 101/450.1, 453, 463.1
See application file for complete search history.

(56) References Cited

U.S. PATENT DOCUMENTS

| | | | | |
|---|---|---|---|---|
| 6,255,033 | B1 | 7/2001 | Levanon et al. | |
| 6,541,181 | B1 | 4/2003 | Levanon et al. | |
| 7,223,506 | B1 | 5/2007 | Kitson et al. | |
| 7,399,576 | B1 | 7/2008 | Levanon | |
| 7,544,462 | B2 | 6/2009 | Levanon et al. | |
| 2008/0160445 | A1 | 7/2008 | Nonaka | |
| 2008/0206678 | A1 * | 8/2008 | Levanon et al. | 430/286.1 |
| 2009/0004599 | A1 | 1/2009 | Levanon et al. | |
| 2009/0162783 | A1 | 6/2009 | Levanon et al. | |
| 2009/0197052 | A1 | 8/2009 | Levanon et al. | |
| 2010/0159390 | A1 * | 6/2010 | Levanon et al. | 430/285.1 |

FOREIGN PATENT DOCUMENTS

| | | | |
|---|---|---|---|
| DE | 21 30 283 | A1 | 12/1971 |
| GB | 834 612 | A | 5/1960 |
| WO | 2004/081662 | | 9/2004 |
| WO | WO 2008/103258 | A1 | 8/2008 |

OTHER PUBLICATIONS

U.S. Appl. No. 12/125,084, filed May 22, 2008, titled Method of Imaging and Developing Positive-Working Imageable Elements, by Levanon et al.
U.S. Appl. No. 12/195,468, filed Aug. 21, 2008, titled Processing of Positive-Working Lithographic Printing Plate Precursor, by Levanon et al.
U.S. Appl. No. 12/339,469, filed Dec. 19, 2008, titled Radiation-Sensitive Compositions and Elements Containing Poly(Vinyl Hydroxyaryl Carboxylic Acid Ester)s, by Levanon et al.

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

Positive-working imageable elements having improved sensitivity, high resolution, and solvent resistance are prepared using a water-insoluble polymeric binder comprising vinyl acetal recurring units that have pendant hydroxyaryl groups, and recurring units comprising carboxylic acid aryl ester groups that are substituted with a cyclic imide group. These imageable elements can be imaged and developed to provide various types of elements including lithographic printing plates.

19 Claims, 1 Drawing Sheet

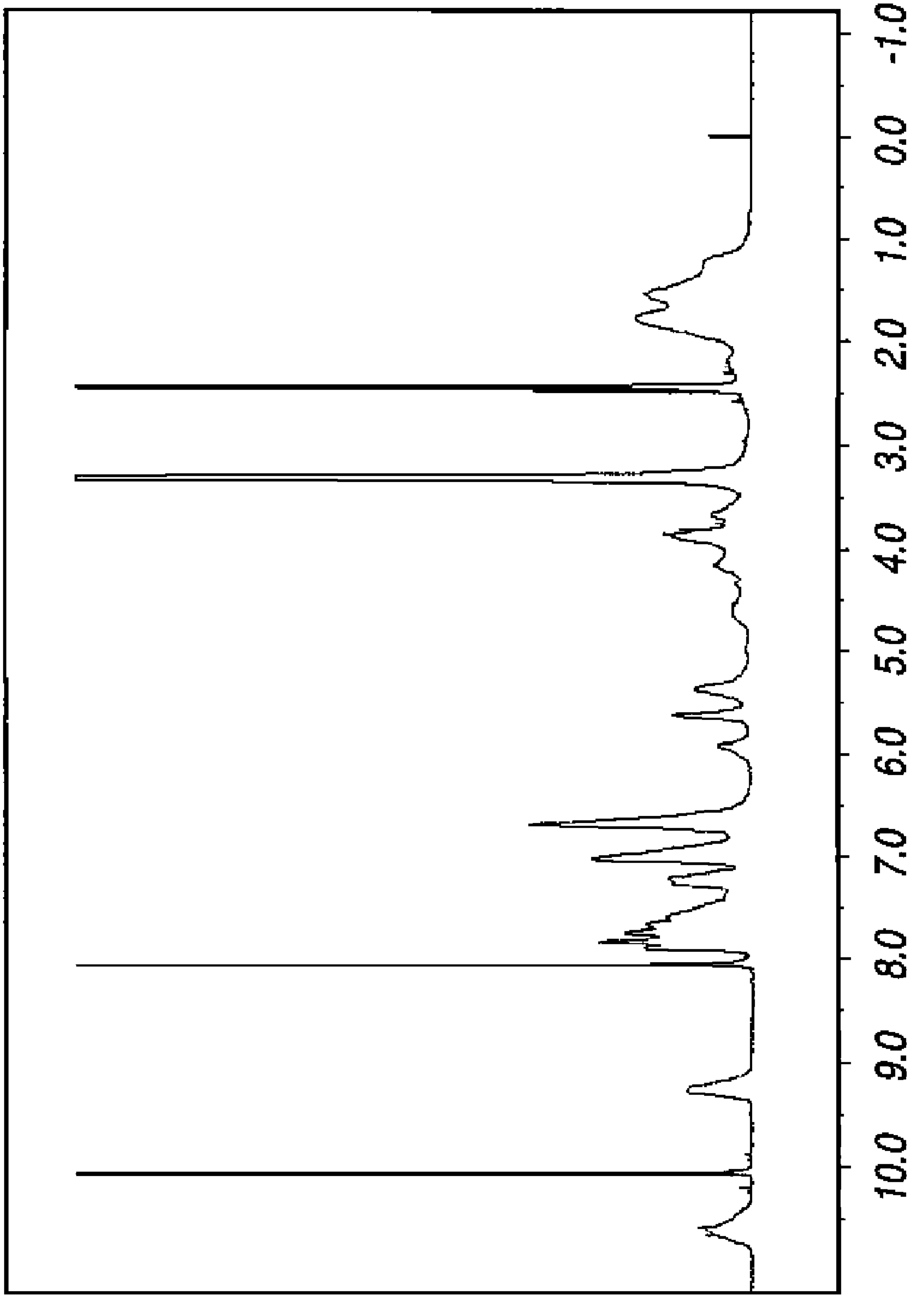
-1.0
0.0
1.0
2.0
3.0
4.0
5.0
6.0
7.0
8.0
9.0
10.0

POSITIVE-WORKING RADIATION-SENSITIVE IMAGEABLE ELEMENTS

FIELD OF THE INVENTION

This invention relates to positive-working radiation-sensitive imageable elements that can be used to make lithographic printing plates. These imageable elements contain unique poly(vinyl acetals) in the imageable layer. It also relates to methods of imaging these elements.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink the ink receptive regions accept the ink and repel the water. The ink is then transferred to the surface of suitable materials upon which the image is to be reproduced. In some instances, the ink can be first transferred to an intermediate blanket that in turn is used to transfer the ink to the surface of the materials upon which the image is to be reproduced.

Imageable elements useful to prepare lithographic (or offset) printing plates typically comprise one or more imageable layers applied over a hydrophilic surface of a substrate (or intermediate layers). The imageable layer(s) can comprise one or more radiation-sensitive components dispersed within a suitable binder. Following imaging, either the exposed regions or the non-exposed regions of the imageable layer(s) are removed by a suitable developer, revealing the underlying hydrophilic surface of the substrate. If the exposed regions are removed, the element is considered as positive-working. Conversely, if the non-exposed regions are removed, the element is considered as negative-working. In each instance, the regions of the imageable layer(s) that remain are ink-receptive, and the regions of the hydrophilic surface revealed by the developing process accept water or aqueous solutions (typically a fountain solution), and repel ink.

Similarly, positive-working compositions can be used to form resist patterns in printed circuit board (PCB) production, thick-and-thin film circuits, resistors, capacitors, and inductors, multichip devices, integrated circuits, and active semiconductive devices.

"Laser direct imaging" methods (LDI) have been known that directly form an offset printing plate or printing circuit board using digital data from a computer, and provide numerous advantages over the previous processes using masking photographic films. There has been considerable development in this field from more efficient lasers, improved imageable compositions and components thereof.

Positive-working imageable compositions containing novolak or other phenolic polymeric binders and diazoquinone imaging components have been prevalent in the lithographic printing plate and photoresist industries for many years. Imageable compositions based on various phenolic resins and infrared radiation absorbing compounds are also well known.

A wide range of thermally-sensitive compositions that are useful in thermal recording materials are described in patent GB 1,245,924 (Brinckman), whereby the solubility of any given area of the imageable layer in a given solvent can be increased by the heating of the layer by indirect exposure to a short duration high intensity visible light and/or infrared radiation transmitted or reflected from the background areas of a graphic original located in contact with the recording material.

Thermally imageable, single- or multi-layer elements are also described in WO 97/39894 (Hoare et al.), WO 98/42507 (West et al.), WO 99/11458 (Ngueng et al.), U.S. Pat. No. 5,840,467 (Kitatani), U.S. Pat. No. 6,060,217 (Ngueng et al.), U.S. Pat. No. 6,060,218 (Van Damme et al.), U.S. Pat. No. 6,110,646 (Urano et al.), U.S. Pat. No. 6,117,623 (Kawauchi), U.S. Pat. No. 6,143,464 (Kawauchi), U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), and U.S. Pat. No. 6,528,228 (Savariar-Hauck et al.), and U.S. Patent Application Publications 2002/0081522 (Miyake et al.) and 2004/0067432 A1 (Kitson et al.).

Positive-working thermally imageable elements containing thermally-sensitive polyvinyl acetals are described in U.S. Pat. Nos. 6,255,033, 6,541,181 (both Levanon et al.), U.S. Pat. No. 7,399,576 (Levanon et al.), and U.S. Pat. No. 7,544,462 (Levanon et al.), WO 04/081662 (Memetea et al.), and U.S. Patent Application Publication 2009/0004599 (Levanon et al.).

Other positive-working imageable elements are described in copending and commonly assigned U.S. Patent Publication No. 2009/0162783 and U.S. Ser. No. 12/025,089 (filed Feb. 4, 2008 by Levanon et al.), U.S. Ser. No. 12/125,084 (filed May 22, 2008 by Levanon et al.), U.S. Ser. No. 12/195,468 (filed Aug. 21, 2008 by Levanon et al.), and Ser. No. 12/339,469 (filed Dec. 19, 2008 by Levanon et al.).

Offset printing plates recently have been the subject of increasing performance demands with respect to imaging sensitivity (imaging speed) and image resolution as well as resistance to common printing room chemicals (chemical resistance). Often, the compositional features used to provide one desired property do not always improve other properties. While the imageable elements described in the patents, publications, and copending applications in the previous two paragraphs have provided useful advances in the art, additional improvements are still desired.

SUMMARY OF THE INVENTION

The present invention provides a positive-working imageable element comprising a substrate having thereon an imageable layer comprising a water-insoluble polymeric binder, and a radiation absorbing compound, wherein the polymeric binder comprises:

a) vinyl acetal recurring units comprising pendant hydroxyaryl groups, and b) recurring units comprising hydroxyaryl ester groups that are substituted with a cyclic imide group, wherein the vinyl acetal recurring units comprising pendant hydroxyaryl groups and the recurring units comprising hydroxyaryl ester groups that are substituted with a cyclic imide group are independently present in the polymeric binder in an amount of at least 10 mol % and 25 mol %, respectively, all based on the total recurring units in the polymeric binder.

In most embodiments, the polymeric binder comprises recurring units represented by each of the following Structures (Ia) and (Ib):

(Ia)

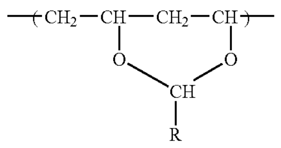

(Ib)

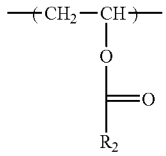

that are described in more detail below, wherein the recurring units of Structure (Ia) are present at from about 10 to about 35 mol %, the recurring units of Structure (Ib) are present at from about 25 to about 60 mol %, all based on the total recurring units in the polymeric binder.

Still other embodiments include the use of a polymeric binder that comprises, in addition to the recurring units from Structures (Ia) and (Ib), from about 25 to about 60 mol % of recurring units represented by the following Structure (Ic):

(Ic)

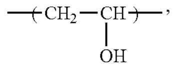

and optionally up to 25 mol % of recurring units represented by the following Structure (Id), optionally up to 10 mol % of recurring units represented by the following Structure (Ie), and optionally up to 20 mol % of recurring units represented by the following Structure (If), all based on the total recurring units in the polymeric binder:

(Id)

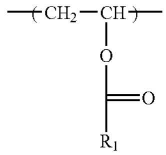

(Ie)

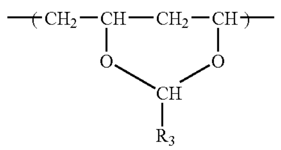

(If)

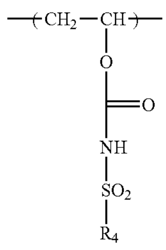

which Structures (Ic) through (If) are described in more detail below.

This invention also provides a method of making an imaged element comprising:

A) imagewise exposing the positive-working imageable element of the present invention to provide exposed and non-exposed regions, and B) developing the imagewise exposed element to remove predominantly only the exposed regions.

The present invention also provides the unique copolymers that are described herein as useful polymeric binders. However, these copolymers are not limited to this sole use. Polymers A through J described below are representative copolymers of this invention.

For example, such imageable elements can be imaged at a wavelength of from about 750 to about 1250 nm to provide a lithographic printing plate having a hydrophilic aluminum-containing substrate.

We have discovered that a need remains for positive-working, single-layer, thermally imageable elements that have improved sensitivity (photospeed) and high image resolution. It is also desired that they would have a resistance to printing press chemicals such as lithographic inks, fountain solutions, and the solvents used in washes that is at least as good as the positive-working printing plates already used in the industry.

The positive-working radiation-sensitive imageable elements of this invention solve the noted problems by exhibiting improved imaging sensitivity. In addition, the imaged elements prepared according to this invention exhibit long run length without the need for a "preheat" step between imaging and development. Moreover, their resistance to press chemicals is also improved. We also found that the imageable elements of this invention provide images with improved printability and high resolution. These advantages have been achieved by using the noted unique class of water-insoluble polymeric binders in the imageable layer. These polymeric binders comprise vinyl acetal recurring units comprising pendant hydroxyaryl groups, and recurring units comprising hydroxyaryl ester groups that are substituted with a cyclic imide group. The vinyl acetal recurring units comprising pendant hydroxyaryl groups and the recurring units comprising hydroxyaryl ester groups that are substituted with a cyclic imide group are independently present in the polymeric binder in an amount of at least 10 mol % and 25 mol %, respectively, based on the total recurring units in the polymer.

BRIEF DESCRIPTION OF THE DRAWING

FIG. 1 is a $^{1}H$ NMR spectrum of polymer A (and internal standards) in DMSO-$d_6$ as described below.

DETAILED DESCRIPTION OF THE INVENTION

Definitions

Unless the context otherwise indicates, when used herein, the terms "imageable element", "positive-working radiation-sensitive imageable element", "positive-working imageable element", and "lithographic printing plate precursor" are meant to be references to embodiments of the present invention.

In addition, unless the context indicates otherwise, the various components described herein such as "radiation absorbing compound", "primary polymeric binder", "secondary polymeric binder", and "developability-enhancing compound", also refer to mixtures of each component. Thus, the use of the articles "a", "an", and "the" is not necessarily meant to refer to only a single component.

Unless otherwise indicated, percentages refer to percents by weight. Percent by weight can be based on the total solids in a formulation or composition, or on the total dry coating weight of a layer.

The term "single-layer imageable element" refers to imageable elements that require only one layer for imaging, but as pointed out in more detail below, such elements may also include one or more layers under or over (such as a topcoat) the imageable layer to provide various properties.

As used herein, the term "radiation absorbing compound" refers to compounds that are sensitive to certain wavelengths of radiation and can convert photons into heat within the layer in which they are disposed. These compounds may also be known as "photothermal conversion materials", "sensitizers", or "light to heat convertors".

For clarification of definition of any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any different definitions set forth herein should be regarded as controlling.

The term "polymer" refers to high and low molecular weight polymers including oligomers and can include both homopolymers and copolymers.

The term "copolymer" refers to polymers that are derived from two or more different monomers, or have two or more different types of recurring units, even if derived from the same monomer.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction of some other means.

Uses

The radiation-sensitive compositions described herein can be used to form resist patterns in printed circuit board (PCB) production, thick-and-thin film circuits, resistors, capacitors, and inductors, multi-chip devices, integrated circuits, and active semi-conductive devices. In addition, they can be used to provide positive-working imageable elements that in turn can be used to provide lithographic printing plates. Other uses of the compositions would be readily apparent to one skilled in the art. Thus, the polymers described herein could be used in coatings, paints, and other formulations that require a binder for any particular reason.

Radiation-Sensitive Compositions

The radiation-sensitive compositions and imageable elements include one or more water-insoluble and optionally alkaline solution-soluble, polymeric binders comprising the recurring units defined below. These polymers are considered the "primary" polymeric binders present in the radiation-sensitive composition or imageable layer. The weight average molecular weight ($M_w$) of the useful polymeric binders is generally at least 5,000 and can be up to 500,000 and typically from about 10,000 to about 100,000. The optimal $M_w$ may vary with the specific polymer and its use.

The polymeric binders comprise at least vinyl acetal recurring units comprising pendant hydroxyaryl groups, and recurring units comprising hydroxyaryl ester groups that are substituted with a cyclic imide group, wherein both types of recurring units are independently present in the polymeric binder in an amount of at least 10 mol % and 25 mol %, respectively, all based on the total recurring units in the polymeric binder.

As noted above, such polymeric binders can often be illustrated by reference recurring units from each of the following Structures (Ia) and (Ib):

(Ia)

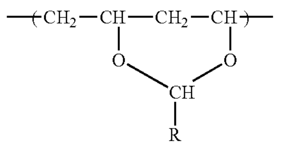

(Ib)

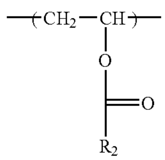

wherein the recurring units of Structure (Ia) are present at from about 10 to about 35 mol % (typically from about 15 to about 25 mol %), and the recurring units of Structure (Ib) are present at from about 25 to about 60 mol % (typically from about 25 to about 45 mol %), all based on the total recurring units in the polymeric binder. There can be recurring units of each Structure but with different R and $R_2$ groups.

In Structures (Ia) and (Ib), R is a substituted or unsubstituted hydroxyaryl group such as a substituted or unsubstituted hydroxyphenyl or hydroxynaphthyl group wherein the aryl group has 1 to 3 hydroxyl groups on the ring. Typically, there is only 1 hydroxyl group on the aryl ring. Other substituents that may optionally be present on the aryl group include but are not limited to, alkyl, alkoxy, halogen, and any other group that does not adversely affect the performance of the polymeric binder in the imageable element.

$R_2$ is a substituted or unsubstituted hydroxyaryl group that is substituted with a cyclic imide group, for example a substituted or unsubstituted hydroxyphenyl or hydroxynaphthyl group that has a cyclic imide substituent such as an aliphatic or aromatic imide group, including but not limited to, maleimide, phthalimide, tetrachlorophthalimide, hydroxyphthalimide, carboxypthalimide, and naphthalimide groups. Further optional substituents on $R_2$ include but are not limited to, hydroxyl, alkyl, alkoxy, halogen, and other groups that do not adversely affect the properties of the cyclic imide group or the polymeric binder in the imageable element. A hydroxyphenyl group, with a cyclic imide substituent and no other substituents, is useful in the polymeric binder.

In some embodiments, the polymeric binder comprises, in addition to the recurring units from Structures (Ia) and (Ib), from about 25 to about 60 mol % (typically from about 30 to about 55 mol %) of recurring units represented by the following Structure (Ic):

(Ic)

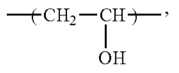

and optionally up to 25 mol % (typically from about 2 to about 15 mol %) of recurring units represented by the following Structure (Id), optionally up to 10 mol % (typically from about 5 to about 8 mol %) of recurring units represented by the following Structure (Ie), and optionally up to 20 mol % (typically from about 5 to about 10 mol %) of recurring units represented by the following Structure (If), all based on the total recurring units in the polymeric binder:

(Id)

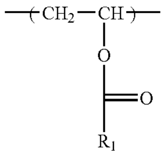

(Ie)

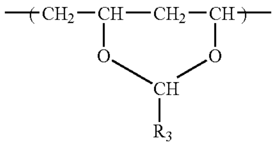

(If)

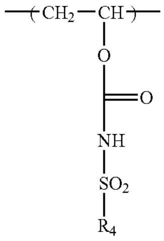

In Structure (Id), $R_1$ is a substituted or unsubstituted linear or branched alkyl group having 1 to 12 carbon atoms (such as methyl, ethyl, n-propyl, n-butyl, n-pentyl, n-hexyl, chloromethyl, trichloromethyl, iso-propyl, iso-butyl, t-butyl, iso-pentyl, neo-pentyl, 1-methylbutyl, iso-hexyl, and dodecyl groups), a substituted or unsubstituted cycloalkyl having 5 to 10 carbon atoms in the carbocyclic ring (such as cyclopentyl, cyclohexyl, 4-methylcyclohexyl, and 4-chlorocyclohexyl), or a substituted or unsubstituted aryl group having 6 or 10 carbon atoms in the aromatic ring (such as phenyl, naphthyl, p-methylphenyl, and, p-chlorophenyl). Such groups can be substituted with one or more substituents such as alkyl, alkoxy, and halogen, or any other substituent that a skilled worker would readily contemplate that would not adversely affect the performance of the polymeric binder in the imageable element.

In Structure (Ie), $R_3$ is an aryl group (such as phenyl or naphthyl group) that is substituted with an $—O_x—(CH_2)_y—COOH$ group wherein x is 0 or 1 and y is 0, 1, or 2. Typically, x is 1 and y is 1, and the aryl group is a phenyl group. This aryl group can have further substituents such as alkyl, alkoxy, or halogen that do not adversely affect the performance of the polymeric binder in the imageable element.

In Structure (If), $R_4$ is a substituted or unsubstituted aryl group having 6 or 10 carbon atoms in the aromatic ring (such as phenyl or naphthyl) and that can have one or more substituents such as alkyl, alkoxy, and others that a skilled worker would readily contemplate as not adversely affecting the properties of the polymeric binder in the imageable element.

In some embodiments, the polymeric binder comprises recurring units represented by each of Structures (Ia) through (If):

(Ia)

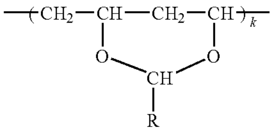

(Ib)

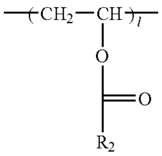

(Ic)

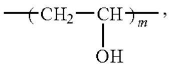

, (Id)

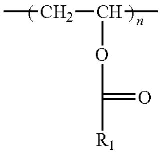

(Ie)

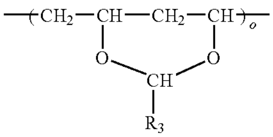

(If)

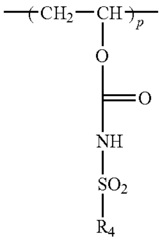

wherein R, $R_1$, $R_2$, $R_3$, $R_4$, x and y are as defined above, k is from about 15 to about 25 mol %, 1 is from about 25 to about 45 mol %, m is from about 30 to about 55 mol %, n is from 0 to about 15 mol %, o is from 0 to about 8 mol %, and p is from 0 to about 10 mol %, all based on total recurring units in the polymeric binder.

In yet other embodiments, the polymeric binder comprises recurring units represented by each of Structures (Ia) through (Id):

(Ia)

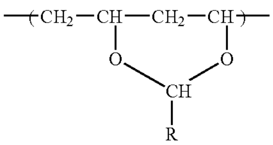

(Ib)

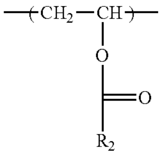

-continued (Ic)

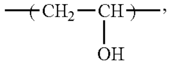

(Id)

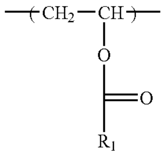

wherein R, $R_1$, and $R_2$ are as defined above.

Further, other embodiments include the use of the polymeric binder that comprises recurring units represented by each of Structures (Ia) through (Ie):

(Ia)

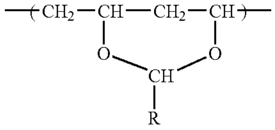

(Ib)

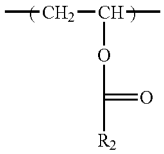

(Ic)

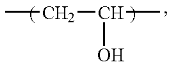

(Id)

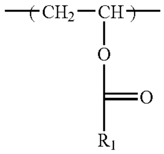

(Ie)

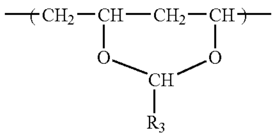

wherein R, $R_1$, $R_2$, $R_3$, x, and y are as defined above.

A primary polymeric binder comprising recurring units that are represented by Structures (Ia) and (Ib), and optionally (Ic), (Id), (Ie), or (If) may contain recurring units other than those defined by the illustrated recurring units and such additional recurring units would be readily apparent to a skilled worker in the art. Thus, the polymeric binders useful in this invention are not limited specifically to the recurring units defined by Structures (Ia) through (If).

There also may be multiple types of recurring units from any of the defined classes of recurring units in Structures (Ia), (Ib), (Id), (Ie), and (If) with different substituents. For example, there may be multiple types of recurring units with different R groups, there may be multiple types of recurring units with different $R_1$ groups, there may be multiple types of recurring units with different $R_2$ groups, there may be multiple types of recurring units with different $R_3$ groups, or there may be multiple types of recurring units with different $R_4$ groups. In addition, the number and type of recurring units in the primary polymeric binders are generally in random sequence, but blocks of specific recurring units may also be present.

The primary polymeric binder is generally present at from about 40 to about 95 weight % (typically from about 50 to about 80 weight %) based on the total dry weight of the imageable layer.

The primary polymer binders used in the present invention can be prepared by trans-esterification of alkyl or aryl esters of hydroxy-substituted aromatic acids with polyvinyl alcohol in the presence of basic catalysts such as metal hydroxides, metal alkoxides, and cyclic amines in dimethylsulfoxide (DMSO) or N-methylpyrrolidone (NMP) or mixtures of these solvents with γ-butyrolactone (BLO).

Some embodiments of the primary polymeric binders have pendant hydroxyaryl groups that are substituted with a cyclic imide (such as a phthalimide group) on the aromatic ring. Such polymers can be prepared by trans-esterification of cyclic imide derivatives of alkyl or aryl esters of hydroxyl-substituted aromatic acids with polyvinyl alcohol in the presence of basic catalysts such as metal hydroxides, metal alkoxides or cyclic amines in DMSO or NMP, or mixtures of these solvents with BLO or by trans-esterification of mixtures of cyclic imide derivatives of alkyl and aryl esters of hydroxyl-substituted aromatic acids with polyvinyl alcohol in the presence of basic catalysts such as metal hydroxides, metal alkoxides or cyclic amines in DMSO or NMP or mixtures of these solvents with BLO.

In (*Acta Polymerica* 41(1990), Nr. 5, 285-289) K. Henning et al. describe esterification of p-hydroxybenzoic acid and o-hydroxybenzoic acid (salicylic acid) with an ethylene-vinyl alcohol copolymer under acidic catalysis in the presence of p-toluenesulfonic acid or ion-exchange resins. These reactions lead to low conversion of esters, that is, 20% in case of p-hydroxybenzoic acid and only 10-12% with salicylic acid.

The ester synthesized by reacting polyvinyl alcohol with 4-amino-2-hydroxy-benzoyl chloride was obtained with very low conversion, that is lower than 10 mol % of ester units in the resulting polymer (S. N. Ushakov et al., *Dokl. Akad. Nauk SSSR,* 141, 1117-1119, 1961). Similar levels of esterification were observed when the methyl ester of 2-hydroxy-4-aminosalicylic acid was transesterified with polyvinyl alcohol under basic catalysis ($NaOCH_3$) (I. S. Varga, S. Wolkover, *Acta Chim. Acad. Sci. Hung.,* 41, 431 1964).

Synthesis of poly(vinyl alcohol-co-vinyl gallate) is described by G. Jialanella and I. Piirma, *Polymer Bulletin* 18, 385-389 (1987), where 3,4,5-trihydroxybenzoate in DMSO in presence of potassium t-butoxide was trans-esterified. The synthesized polymers were water soluble that suggests that the conversion was low.

For the synthesis of the polymers useful in this invention, we used the basic catalysis for the transesterification of the methyl or phenyl esters of the hydroxybenzoic acids with polyvinyl alcohol (PVA) in organic solvents that are able to dissolve the PVA-NMP or DMSO. The catalysts used were sodium methoxide, potassium t-butoxide, dry KOH, and cyclic amines like DBU {1,8-diazabicyclo[5,4,0]undec-7-ene (98%)}. It is important to dry the PVA before the reaction of trans-esterification. We were surprised to learn that the conversion of the PVA to a copolymer of poly(vinyl alcohol-co-hydroxy-substituted aryl ester) is very high in the case of the o-hydroxybenzoic (salicylic acid) where it reaches 85-90% compared to low 10-20% conversion for the esters of 3, or 4-hydroxysubstituted benzoic acids, 3,4-dihydroxybenzoic acid, and gallic acid. When an ester of an o-hydroxybenzoic acid containing an electron withdrawing group like nitro group on the aromatic ring is used in the trans-esterification reaction with PVA, the conversion is also low.

The primary polymeric binders described herein can be used alone or in admixture with other alkali soluble polymeric binders, identified herein as "secondary polymeric binders". These additional polymeric binders include other poly(vinyl acetal)s, for example, the poly(vinyl acetal)s described in U.S. Pat. Nos. 6,255,033 and 6,541,181 (noted above), WO 04/081662 (also noted above), and in U.S. Patent Application Publication 2008/0206678 (Levanon et al.), which publications are incorporated herein by reference.

The type of the secondary polymeric binder that can be used together with the primary polymeric binder is not particularly restricted. In general, from a viewpoint of not diminishing the positive radiation-sensitivity of the imageable element, the secondary polymeric binder is generally an alkali-soluble polymer also.

Other useful secondary polymeric binders include phenolic resins, including novolak resins such as condensation polymers of phenol and formaldehyde, condensation polymers of m-cresol and formaldehyde, condensation polymers ofp-cresol and formaldehyde, condensation polymers of m-/p-mixed cresol and formaldehyde, condensation polymers of phenol, cresol (m-, p-, or m-/p-mixture) and formaldehyde, and condensation copolymers of pyrogallol and acetone. Further, copolymers obtained by copolymerizing compound comprising phenol groups in the side chains can be used. Mixtures of such polymeric binders can also be used.

Examples of other useful secondary polymeric binders include the following classes of polymers having an acidic group in (1) through (5) shown below on a main chain and/or side chain (pendant group).

(1) sulfone amide ($—SO_2NH—R'$), (2) substituted sulfonamido based acid group (hereinafter, referred to as active imido group) [such as $—SO_2NHCOR'$, $SO_2NHSO_2R'$, $—CONHSO_2R'$], (3) carboxylic acid group ($—CO_2H$), (4) sulfonic acid group ($—SO_3H$), and (5) phosphoric acid group ($—OPO_3H_2$).

R' in the above-mentioned groups (1)-(5) represents hydrogen or a hydrocarbon group.

Representative secondary polymeric binders having the group (1) sulfone amide group are for instance, polymers that are constituted of a minimum constituent unit as a main component derived from a compound having a sulfone amide group. Thus, examples of such a compound include a compound having, in a molecule thereof, at least one sulfone amide group in which at least one hydrogen atom is bound to a nitrogen atom and at least one polymerizable unsaturated group. Among these compounds are m-aminosulfonylphenyl methacrylate, N-(p-aminosulfonylphenyl)methacrylamide, and N-(p-aminosulfonylphenyl)acrylamide. Thus, a homopolymer or a copolymer of polymerizing monomers having a sulfonamide group such as m-aminosulfonylphenyl methacrylate, N-(p-aminosulfonylphenyl)methacrylamide, or N-(p-aminosulfonylphenyl)acrylamide can be used.

Examples of secondary polymeric binders with group (2) activated imido group are polymers comprising recurring units derived from compounds having activated imido group as the main constituent component. Examples of such compounds include polymerizable unsaturated compounds having a moiety defined by the following structural formula.

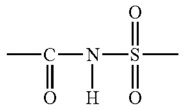

N-(p-toluenesulfonyl)methacrylamide and N-(p-toluenesulfonyl)acrylamide are examples of such polymerizable compounds.

Secondary polymeric binders having any of the groups (3) through (5) include those readily prepared by reacting ethylenically unsaturated polymerizable monomers having the desired acidic groups, or groups that can be converted to such acidic groups after polymerization.

The secondary polymeric binder can have a weight average molecular weight of at least 2,000 and a number average molecular weight of at least 500. Typically, the weight average molecular weight is from about 5,000 to about 300,000, the number average molecular weight is from about 800 to about 250,000, and the degree of dispersion (weight average molecular weight/number average molecular weight) is from about 1.1 to about 10.

Mixtures of the secondary polymeric binders may be used with the one or more primary polymeric binders. The secondary polymeric binder(s) can be present in an amount of at least 1 weight % and up to 50 weight %, and typically from about 5 to about 30 weight %, based on the dry weight of the total polymeric binders in the radiation-sensitive composition or imageable layer.

The radiation-sensitive composition can also include a developability-enhancing compound. WO 2004/081662 (Memetea et al.) describes the use of various developability-enhancing compounds of acidic nature to enhance the sensitivity of positive-working compositions and elements so that required imaging energy is reduced.

Acidic Developability-Enhancing Compounds (ADEC), such as carboxylic acids or cyclic acid anhydrides, sulfonic acids, sulfinic acids, alkylsulfuric acids, phosphonic acids, phosphinic acids, phosphonic acid esters, phenols, sulfonamides, or sulfonimides may permit further improved developing latitude and printing durability. Representative examples of such compounds are provided in [0030] to [0036] of U.S. Patent Application Publication 2005/0214677 (noted above) that is incorporated herein by reference with respect to these acid developability-enhancing compounds. Such compounds may be present in an amount of from about 0.1 to about 30 weight % based on the total dry weight of the radiation-sensitive composition or imageable layer.

The radiation-sensitive composition can also include a developability-enhancing composition containing one or more developability-enhancing compounds (DEC) as described in U.S. Patent Publication No. 2009/0162783 that is also incorporated herein by reference. Representative developability-enhancing compounds can be defined by the following Structure (DEC):

$$[HO—C(=O)]_m\text{-}A\text{-}[N(R_4)(R_5)]_n$$

(DEC)

In Structure DEC, $R_4$ and $R_5$ can be the same or different hydrogen or substituted or unsubstituted, linear or branched alkyl groups having 1 to 6 carbon atoms, substituted or unsubstituted cycloalkyl groups having 5 to 10 carbon atoms in the hydrocarbon ring, or substituted or unsubstituted aryl groups having 6, 10, or 14 carbon atoms in the aromatic ring. In some embodiments, $R_4$ and $R_5$ can be the same or different substituted or unsubstituted aryl groups (such as phenyl or naphthyl groups), and it is particularly useful that at least one of $R_4$ and $R_5$ is a substituted or unsubstituted aryl group when A includes an alkylene group directly connected to —[N($R_4$)($R_5$)]$_n$.

In other embodiments, $R_4$ and $R_5$ can be the same or different hydrogen or substituted or unsubstituted, linear or branched alkyl groups having 1 to 6 carbon atoms (as noted above), substituted or unsubstituted cyclohexyl groups, or substituted or unsubstituted phenyl or naphthyl groups.

In Structure (DEC), A is a substituted or unsubstituted organic linking group having at least one carbon, nitrogen, sulfur, or oxygen atom in the chain, wherein A also comprises a substituted or unsubstituted arylene group (such as a substituted or unsubstituted phenylene group) directly connected to —[N($R_4$)($R_5$)]$_n$. Thus, A can include one or more arylene (for example, having 6 or 10 carbon atoms in the aromatic ring), cycloalkylene (for example, having 5 to 10 carbon atoms in the carbocyclic ring), alkylene (for example, having 1 to 12 carbon atoms in the chain, including linear and branched groups), oxy, thio, amido, carbonyl, carbonamido, sulfonamido, ethenylene (—CH═CH—), ethinylene (—C≡C—), seleno groups, or any combination thereof. In some particularly useful embodiments, A consists of a substituted or unsubstituted arylene group (such as a substituted or unsubstituted phenylene group).

In Structure (DEC), m is an integer of 1 to 4 (typically 1 or 2) and n is an integer of 1 to 4 (typically 1 or 2), wherein m and n can be the same or different.

In still other embodiments, the developability-enhancing compound can be defined by the following Structure ($DEC_1$):

$$[HO—C(═O)]_m—B\text{-}A\text{-}[N(R_4)(R_5)]_n$$

($DEC_1$)

wherein $R_4$ and $R_5$ are as defined above, A is an organic linking group having a substituted or unsubstituted phenylene directly attached to —[N($R_4$)($R_5$)]$_n$, B is a single bond or an organic linking group having at least one carbon, oxygen, sulfur, or nitrogen atom in the chain, m is an integer of 1 or 2, n is an integer of 1 or 2. The “B” organic linking group can be defined the same as A is defined above except that it is not required that B contain an arylene group, and usually B, if present, is different than A.

The aryl (and arylene), cycloalkyl, and alkyl (and alkylene) groups described herein can have optionally up to 4 substituents including but not limited to, hydroxy, methoxy and other alkoxy groups, aryloxy groups such phenyloxy, thioaryloxy groups, halomethyl, trihalomethyl, halo, nitro, azo, thiohydroxy, thioalkoxy groups such as thiomethyl, cyano, amino, carboxy, ethenyl and other alkenyl groups, carboxyalkyl, aryl groups such as phenyl, alkyl groups, alkynyl, cycloalkyl, heteroaryl, and heteroalicyclic groups.

The imageable elements can include one or more aminobenzoic acids, dimethylaminobenzoic acids, aminosalicyclic acids, indole acetic acids, anilinodiacetic acids, N-phenyl glycine, or any combination thereof as developability-enhancing compounds. For example, such compounds can include but are not limited to, 4-aminobenzoic acid, 4-(N,N'-dimethylamino)benzoic acid, anilino(di)acetic acid, N-phenyl glycine, 3-indoleacetic acid, and 4-aminosalicyclic acid.

The one or more developability enhancing compounds described above are generally present in an amount of from about 1 to about 30 weight %, or typically from about 2 to about 20 weight %.

In many embodiments, the radiation-sensitive composition and imageable element can have the primary polymeric binder(s) described above that are present at a coverage of from about 40 to about 95 weight %, one or more developability-enhancing compounds present at a coverage of from about 1 to about 30 weight %, and one or more radiation absorbing compounds that are infrared radiation absorbing compounds that are present at a coverage of from about 0.1 to about 30 weight %.

It is also possible to use one or more of the developability-enhancing compounds of Structure (DEC) or ($DEC_1$) in combination with one or more Acidic Developability-Enhancing Compounds (ADEC), provided in [0030] to [0036] of U.S. Patent Application Publication 2005/0214677 (noted above).

In some instances, at least two of these acidic developability-enhancing compounds are used in combination with one or more (such as two) of the developability-enhancing compounds described above by Structure (DEC) or ($DEC_1$).

In the combinations of the two types of developability-enhancing compounds described above, the molar ratio of one or more compounds represented by Structure (DEC) or ($DEC_1$) to one or more (ADEC) developability-enhancing compounds can be from about 0.1:1 to about 10:1 and more typically from about 0.5:1 to about 2:1.

Still again, the developability-enhancing compounds described by Structure (DEC) or ($DEC_1$) can be used in combination with basic developability-enhancing compounds that can be defined by the following Structure (BDEC):

$$(R^7)_s—N—[(CR^8R^9)_t—OH]_v$$

(BDEC)

wherein t is 1 to 6, s is 0, 1, or 2, and v is 1 to 3, provided that the sum of s and v is 3. When s is 1, $R^7$ is hydrogen or an alkyl, alkylamine, cycloalkyl, heterocycloalkyl, aryl, arylamine, or heteroaryl group, and when s is 2, the multiple $R^7$ groups can be the same or different alkyl, alkylamine, cycloalkyl, heterocycloalkyl, aryl, arylamine, or heteroaryl groups, or the two $R^7$ groups together with the nitrogen atom, can form a substituted or unsubstituted heterocyclic ring. $R^8$ and $R^9$ are independently hydrogen or an alkyl group.

Examples of such organic BDEC compounds are N-(2-hydroxyethyl)-2-pyrrolidone, 1-(2-hydroxyethyl)piperazine, N-phenyldiethanolamine, triethanolamine, 2-[bis(2-hydroxyethyl)amino]-2-hydroxymethyl-1.3-propanediol, N,N,N',N'-tetrakis(2-hydroxyethyl)-ethylenediamine, N,N,N',N'-tetrakis(2-hydroxypropyl)-ethylenediamine, 3-[(2-hydroxyethyl)phenylamino]propionitrile, and hexahydro-1,3,5-tris(2-hydroxyethyl)-s-triazine. Mixtures of two or more of these compounds are also useful.

In the combinations of the two types of developability-enhancing compounds described above, the molar ratio of one or more compounds represented by Structure (DEC) or ($DEC_1$) to one or more (BDEC) developability-enhancing compounds can be from about 0.1:1 to about 10:1 and more typically from about 0.5:1 to about 2:1.

Still again, the compounds described above by Structure (DEC) or ($DEC_1$) can be used in combination with one or more of the compounds identified above as ADEC compound, and with one or more of the compounds identified above by Structure (BDEC) in any suitable molar ratio.

The radiation-sensitive composition can include other optional addenda as described below for the imageable layer.

Imageable Elements

The imageable elements are positive-working imageable elements and the primary polymeric binders described herein are generally present as polymeric binders in a single imageable layer.

In general, the imageable elements are formed by suitable application of a formulation of the radiation-sensitive composition that contains one or more primary polymeric binders, a radiation absorbing compound (described below), optionally a developability-enhancing composition, and other optional addenda, to a suitable substrate to form an imageable layer. This substrate is usually treated or coated in various ways as described below prior to application of the formulation. For example, the substrate can be treated to provide an "interlayer" for improved adhesion or hydrophilicity, and the imageable layer is applied over the interlayer.

The substrate generally has a hydrophilic surface, or a surface that is more hydrophilic than the applied imaging formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One substrate is composed of an aluminum support that may be coated or treated using techniques known in the art, including physical graining, electrochemical graining and chemical graining, followed by anodizing. The aluminum sheet is mechanically or electrochemically grained and anodized using phosphoric acid or sulfuric acid and conventional procedures.

An optional interlayer may be formed by treatment of the aluminum support with, for example, a silicate, dextrine, calcium zirconium fluoride, hexafluorosilicic acid, phosphate/sodium fluoride, poly(vinyl phosphonic acid) (PVPA), vinyl phosphonic acid copolymer, poly(acrylic acid), or acrylic acid copolymer solution, or an alkali salt of a condensed aryl sulfonic acid as described in GB 2,098,627 and Japanese Kokai 57-195697A (both Herting et al.). The grained and anodized aluminum support can be treated with poly(acrylic acid) using known procedures to improve surface hydrophilicity.

The thickness of the substrate can be varied but should be sufficient to sustain the wear from printing and thin enough to wrap around a printing form. Some embodiments include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaged cylinders is described for example in U.S. Pat. No. 5,713,287 (Gelbart).

The imageable layer (and radiation-sensitive composition) typically also comprises one or more radiation absorbing compounds. While these compounds can be sensitive to any suitable energy form (for example, UV, visible, and IR radiation) from about 150 to about 1500 nm, they are typically sensitive to infrared radiation and thus, the radiation absorbing compounds are known as infrared radiation absorbing compounds ("IR absorbing compounds") that generally absorb radiation from about 700 to about 1400 nm and typically from about 750 to about 1250 nm. The imageable layer is generally the outermost layer in the imageable element.

Examples of suitable IR dyes include but are not limited to, azo dyes, squarylium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squarine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have from about two sulfonic acid groups, such as two sulfonic acid groups and two indolenine groups as described for example in U.S. Patent Application Publication 2005-0130059 (Tao).

A general description of a useful class of suitable cyanine dyes is shown by the formula in [0026] of WO 2004/101280 (Munnelly et al.).

In addition to low molecular weight IR-absorbing dyes, IR dye moieties bonded to polymers can be used. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), and U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds can also be pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer and preferably the pigment particle size will be less than half the thickness of the imageable layer.

In the imageable elements, the radiation absorbing compound is generally present at a dry coverage of from about 0.1 to about 30 weight %, or it is an IR dye that is present in an amount of from about 0.5 to about 15 weight %. The particular amount needed for this purpose would be readily apparent to one skilled in the art, depending upon the specific compound used.

Alternatively, the radiation absorbing compounds may be included in a separate layer that is in thermal contact with the imageable layer. Thus, during imaging, the action of the radiation absorbing compound in the separate layer can be transferred to the imageable layer without the compound originally being incorporated into it.

The imageable layer (and radiation-sensitive composition) can also include one or more additional compounds that are colorant dyes, or UV or visible light-sensitive components. Colorant dyes that are soluble in an alkaline developer are useful. Useful polar groups for colorant dyes include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as colorant dyes include, for example, tetraalkyl ammonium compounds and quaternized heterocyclic compounds such as quinolinium compounds, benzothiazolium compounds, pyridinium compounds, and imidazolium compounds. Further details and representative compounds useful as dissolution inhibitors are described for example in U.S. Pat. No. 6,294,311 (noted above). Useful colorant dyes include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France). These compounds can act as contrast dyes that distinguish the non-exposed (non-imaged) regions from the exposed (imaged) regions in the developed imageable element.

When a colorant dye is present in the imageable layer, its amount can vary widely, but generally it is present in an amount of from about 0.5 weight % to about 30 weight %.

The imageable layer (and radiation-sensitive composition) can further include a variety of additives including dispersing agents, humectants, biocides, plasticizers, surfactants for coatability or other properties, viscosity builders, fillers and extenders, pH adjusters, drying agents, defoamers, preservatives, antioxidants, development aids, rheology modifiers or combinations thereof, or any other addenda commonly used in the lithographic art, in conventional amounts.

The positive-working imageable element can be prepared by applying the imageable layer (radiation-sensitive composition) formulation over the surface of the substrate (and any other hydrophilic layers provided thereon) using conventional coating or lamination methods. Thus, the formulation can be applied by dispersing or dissolving the desired ingredients in a suitable coating solvent, and the resulting formulation is applied to the substrate using suitable equipment and procedures, such as spin coating, knife coating, gravure coating, die coating, slot coating, bar coating, wire rod coating, roller coating, or extrusion hopper coating. The formulation can also be applied by spraying onto a suitable support (such as an on-press printing cylinder).

The coating weight for the imageable layer is from about 0.5 to about 3.5 g/m$^2$ and typically from about 1 to about 3 g/m$^2$.

The selection of solvents used to coat the layer formulation(s) depends upon the nature of the polymeric binders and other polymeric materials and non-polymeric components in the formulations. Generally, the imageable layer formulation is coated out of acetone, methyl ethyl ketone, or another ketone, tetrahydrofuran, 1-methoxy-2-propanol, N-methyl pyrrolidone, 1-methoxy-2-propyl acetate, γ-butyrolactone, and mixtures thereof using conditions and techniques well known in the art.

Intermediate drying steps may be used between applications of the various layer formulations to remove solvent(s) before coating other formulations. Drying steps may also help in preventing the mixing of the various layers.

Representative methods for preparing positive-working imageable elements are described below in the examples.

After the imageable layer formulation is dried on the substrate (that is, the coating is self-supporting and dry to the touch), the element can be heat treated at from about 40 to about 90° C. (typically at from about 50 to about 70° C.) for at least 4 hours and preferably at least 20 hours, or for at least 24 hours. The maximum heat treatment time can be several days, but the optimal time and temperature for the heat treatment can be readily determined by routine experimentation. This heat treatment can also be known as a "conditioning" step. Such treatments are described for example, in EP 823,327 (Nagaska et al.) and EP 1,024,958 (McCullough et al.).

It may also be desirable that during the heat treatment, the imageable element is wrapped or encased in a water-impermeable sheet material to represent an effective barrier to moisture removal from the precursor. This sheet material is sufficiently flexible to conform closely to the shape of the imageable element (or stack thereof) and is generally in close contact with the imageable element (or stack thereof). For example, the water-impermeable sheet material is sealed around the edges of the imageable element or stack thereof. Such water-impermeable sheet materials include polymeric films or metal foils that are sealed around the edges of imageable element or stack thereof. More details of this process are provided in U.S. Pat. No. 7,175,969 (Ray et al.).

Imaging and Development

The imageable elements of this invention can have any useful form including, but not limited to, printing plate precursors, printing cylinders, printing sleeves and printing tapes (including flexible printing webs). For example, the imageable members are lithographic printing plate precursors for forming lithographic printing plates.

Printing plate precursors can be of any useful size and shape (for example, square or rectangular) having the requisite imageable layer disposed on a suitable substrate. Printing cylinders and sleeves are known as rotary printing members having the substrate and imageable layer in a cylindrical form. Hollow or solid metal cores can be used as substrates for printing sleeves.

During use, the imageable elements are exposed to a suitable source of radiation such as UV, visible light, or infrared radiation, depending upon the radiation absorbing compound present in the radiation-sensitive composition, at a wavelength of from about 150 to about 1500 nm. For most embodiments, imaging is carried out using an infrared laser at a wavelength of from about 700 to about 1400 nm. The laser used to expose the imaging member is can be a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at one or more wavelengths with the range of from about 750 to about 1250 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. A useful imaging apparatus is available as models of Kodak Trendsetter imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

IR Imaging speeds may be from about 30 to about 1500 $mJ/cm^2$ or typically from about 40 to about 300 $mJ/cm^2$.

While laser imaging is usually practiced, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, as Fujitsu Thermal Head FTP-040 MCS001 and TDK Thermal Head F415 HH7-1089).

Imaging is generally carried out using direct digital imaging. The image signals are stored as a bitmap data file on a computer. Such data files may be generated by a raster image processor (RIP) or other suitable means. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable developer removes predominantly only the exposed regions of the imageable layer and any layers underneath it, and exposing the hydrophilic surface of the substrate. Thus, such imageable elements are "positive-working" (for example, "positive-working" lithographic printing plate precursors).

Thus, development is carried out for a time sufficient to remove the imaged (exposed) regions of the imageable layer, but not long enough to remove the non-imaged (non-exposed) regions of the imageable layer. The imaged (exposed) regions of the imageable layer are described as being "soluble" or "removable" in the developer because they are removed, dissolved, or dispersed within the developer more readily than the non-imaged (non-exposed) regions of the imageable layer. Thus, the term "soluble" also means "dispersible".

The imaged elements are generally developed using conventional processing conditions. Both aqueous alkaline developers and organic solvent-containing developers can be used. In most embodiments of the method of this invention, the higher pH aqueous alkaline developers that are commonly used to process positive-working imaged elements are used.

Such aqueous alkaline developers generally have a pH of at least 9 and typically of at least 11. Useful alkaline aqueous developers include 3000 Developer, 9000 Developer, GoldStar Developer, GoldStar Plus Developer, GoldStar Premium Developer, GREENSTAR Developer, ThermalPro Developer, PROTHERM Developer, MX1813 Developer, and MX1710 Developer (all available from Eastman Kodak Company), as well as Fuji HDP7 Developer (Fuji Photo) and Energy CTP Developer (Agfa). These compositions also generally include surfactants, chelating agents (such as salts of ethylenediaminetetraacetic acid), and various alkaline agents (such as inorganic metasilicates, organic metasilicates, hydroxides, and bicarbonates).

It may also be possible to use developers that are commonly used to process negative-working imaged elements. Such developers are generally single-phase solutions containing one or more organic solvents that are miscible with water. Useful organic solvents the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as methoxyethanol and 2-butoxyethanol. The organic solvent(s) is generally present in an amount of from about 0.5 to about 15% based on total developer weight. Such developers can be neutral, alkaline, or slightly acidic in pH. Most of these developers are alkaline in pH, for example up to 11.

Representative organic solvent-containing developers include ND-1 Developer, 955 Developer, "2 in 1" Developer, 956 Developer, and 980 Developer (available from Eastman Kodak Company), HDN-1 Developer (available from Fuji), and EN 232 Developer (available from Agfa).

Generally, the developer is applied to the imaged element by rubbing or wiping it with an applicator containing the developer. Alternatively, the imaged element can be brushed with the developer or the developer may be applied by spraying the element with sufficient force to remove the exposed regions. Still again, the imaged element can be immersed in the developer. In all instances, a developed image is produced in a lithographic printing plate having excellent resistance to press room chemicals. Development can be carried out in suitable apparatus containing suitable rollers, brushes, tanks, and plumbing for delivery, disposal, or recirculation of solutions if desired.

Following development, the imaged element can be rinsed with water and dried in a suitable fashion. The dried element can also be treated with a conventional gumming solution (preferably gum arabic).

The imaged and developed element can also be baked in a post-exposure bake operation that can be carried out to increase run length of the resulting imaged element. Baking can be carried out, for example at from about 220° C. to about 260° C. for from about 1 to about 10 minutes, or at about 120° C. for about 30 minutes.

Printing can be carried out by applying a lithographic ink and fountain solution to the printing surface of the imaged element. The ink is taken up by the non-imaged (non-exposed or non-removed) regions of the imageable layer and the fountain solution is taken up by the hydrophilic surface of the substrate revealed by the imaging and development process.

The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The present invention provides at least the following embodiments:

1. A positive-working imageable element comprising a substrate having thereon an imageable layer comprising a water-insoluble polymeric binder, and a radiation absorbing compound, wherein the polymeric binder comprises:

a) vinyl acetal recurring units comprising pendant hydroxyaryl groups, and b) recurring units comprising hydroxyaryl ester groups that are substituted with a cyclic imide group, wherein the vinyl acetal recurring units comprising pendant hydroxyaryl groups and the recurring units comprising hydroxyaryl ester groups that are substituted with a cyclic imide group are independently present in the polymeric binder in an amount of at least 10 mol % and 25 mol %, respectively, all based on the total recurring units in the polymeric binder.

2. The element of embodiment 1 wherein the polymeric binder comprises recurring units represented by each of the following Structures (Ia) and (Ib):

(Ia)

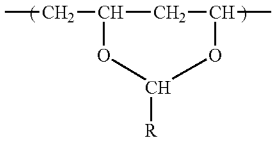

(Ib)

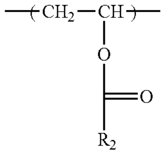

wherein the recurring units of Structure (Ia) are present at from about 10 to about 35 mol %, the recurring units of Structure (Ib) are present at from about 25 to about 60 mol %, all based on total recurring units in the polymeric binder, R is a substituted or unsubstituted hydroxyaryl group, and $R_2$ is a substituted or unsubstituted hydroxyaryl group that is substituted with a cyclic imide group.

3. The element of embodiment 2 wherein R is a substituted or unsubstituted hydroxyphenyl group and $R_2$ is a hydroxyphenyl group that is substituted with a cyclic imide group.

4. The element of embodiment 1 or 2 wherein the polymeric binder further comprises from about 25 to about 60 mol % of recurring units represented by the following Structure (Ic):

(Ic)

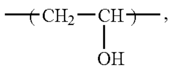

and optionally up to 25 mol % of recurring units represented by the following Structure (Id), optionally up to 10 mol % of recurring units represented by the following Structure (Ie), and optionally up to 20 mol % of recurring units represented by the following Structure (If), all based on the total recurring units in the polymeric binder:

(Id)

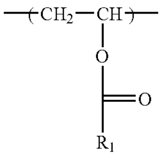

(Ie)

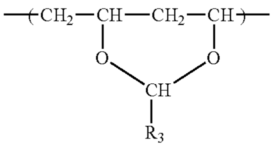

(If)

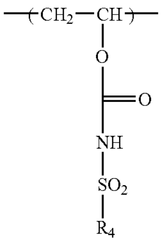

wherein $R_1$ is a substituted or unsubstituted alkyl, substituted or unsubstituted cycloalkyl, or substituted or unsubstituted aryl group, $R_3$ is an aryl group that is substituted with an $—O_x—(CH_2)_y—COOH$ group wherein x is 0 or 1 and y is 0, 1, or 2, and $R_4$ is a substituted or unsubstituted aryl group.

5. The element of any of embodiments 2 to 4 wherein the recurring units represented by Structure (Ia) are present at from about 15 to about 25 mol %, and the recurring units represented by Structure (Ib) are present at from about 25 to about 45 mol %, all based on the total recurring units in the polymeric binder.

6. The element of any of embodiments 1 to 5 wherein the polymeric binder comprises recurring units represented by each of Structures (Ia) through (If):

(Ia)

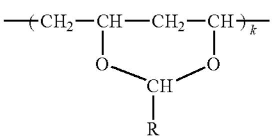

(Ib)

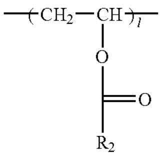

(Ic)

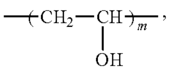

-continued (Id)

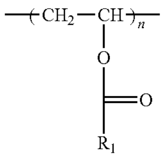

(Ie)

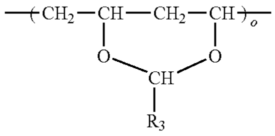

(If)

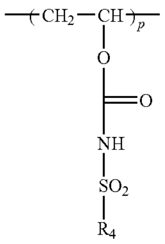

wherein R is a hydroxyphenyl group, $R_1$ is a substituted or unsubstituted alkyl, substituted or unsubstituted cycloalkyl, or substituted or unsubstituted aryl group, $R_2$ is a hydroxyphenyl group that is substituted with a cyclic imide group, $R_3$ is an aryl group that is substituted with an $—O_x—(CH_2)_y—COOH$ group wherein x is 0 or 1 and y is 0, 1, or 2, $R_4$ is a substituted or unsubstituted aryl group, k is from about 15 to about 25 mol %, 1 is from about 25 to about 45 mol %, m is from about 30 to about 55 mol %, n is from 0 to about 15 mol %, o is from 0 to about 8 mol %, and p is from 0 to about 10 mol %, all based on the total recurring units in the polymeric binder.

7. The element of any of embodiments 1 to 6 wherein the polymeric binder is present at from about 40 to about 95 weight % based on the total dry weight of the imageable layer, and the radiation absorbing compound is an infrared radiation absorbing compound that is present at from about 0.1 to about 30 weight %, based on the total dry weight of the layer in which it is located.

8. The element of any of embodiments 1 to 7 further comprising a colorant dye or a UV- or visible-light sensitive component, or both, in the imageable layer.

9. The element of any of embodiments 1 to 8 further comprising a developability enhancing compound.

10. The element of any of embodiments 1 to 5 and 7 to 9 wherein the polymeric binder comprises recurring units represented by each of Structures (Ia) through (Id):

(Ia)

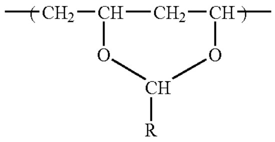

(Ib)

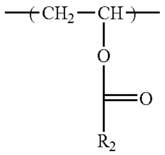

-continued (Ic)

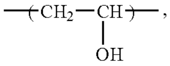

, (Id)

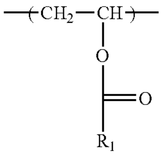

wherein R is a substituted or unsubstituted hydroxyphenyl group, $R_1$ is a substituted or unsubstituted alkyl, substituted or unsubstituted cycloalkyl, or substituted or unsubstituted aryl group, and $R_2$ is a hydroxyphenyl group that is substituted with a cyclic imide group.

11. The element of any of embodiments 1 to 5 and 7 to 9 wherein the polymeric binder comprises recurring units represented by each of Structures (Ia) through (Ie):

(Ia)

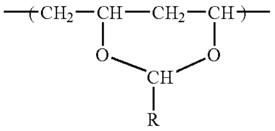

(Ib)

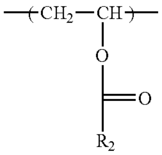

(Ic)

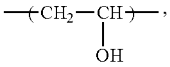

, (Id)

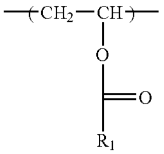

(Ie)

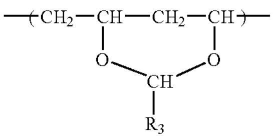

wherein R is a substituted or unsubstituted hydroxyphenyl group, $R_1$ is a substituted or unsubstituted alkyl, substituted or unsubstituted cycloalkyl, or substituted or unsubstituted aryl group, $R_2$ is a hydroxyphenyl group that is substituted with a cyclic imide group, and $R_3$ is an aryl group that is substituted with an $—O_x—(CH_2)_y—COOH$ group wherein x is 0 or 1 and y is 0, 1, or 2.

12. The element of any of embodiments 1 to 9 wherein the polymeric binder comprises recurring units represented by each of Structures (Ia) through (If):

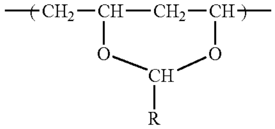

(Ia)

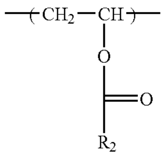

(Ib)

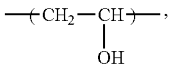

(Ic)

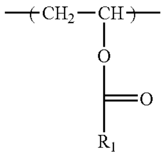

(Id)

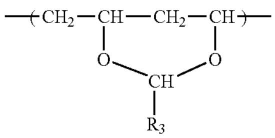

(Ie)

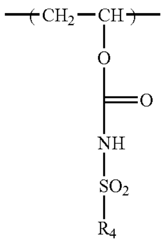

(If)

wherein R is a substituted or unsubstituted hydroxyphenyl group, $R_1$ is a substituted or unsubstituted alkyl, substituted or unsubstituted cycloalkyl, or substituted or unsubstituted aryl group, $R_2$ is a hydroxyphenyl group that is substituted with a cyclic imide group, $R_3$ is an aryl group that is substituted with an $—O_x—(CH_2)_y—COOH$ group wherein x is 0 or 1 and y is 0, 1, or 2, and $R_4$ is a substituted or unsubstituted aryl group.

13. A method of making an imaged element comprising:

A) imagewise exposing the positive-working imageable element of any of embodiments 1 to 12 to provide exposed and non-exposed regions, and B) developing the imagewise exposed element to remove predominantly only the exposed regions.

14. The method of embodiment 13 wherein the imageable element is imaged at a wavelength of from about 750 to about 1250 nm to provide a lithographic printing plate having a hydrophilic aluminum-containing substrate.

The following examples are presented as a means to illustrate the practice of this invention but the invention is not intended to be limited thereby.

EXAMPLES

The following components were used in the preparation and use of the examples. Unless otherwise indicated, the components are available from Aldrich Chemical Company (Milwaukee, Wis.):

ABA represents 4-aminobenzoic acid.

BF-03 represents a poly(vinyl alcohol), 98% hydrolyzed (Mw=15,000) that was obtained from Chang Chun Petrochemical Co. Ltd. (Taiwan).

BLO represents γ-butyrolactone.

BPA 1100 is a resole resin that was obtained from Georgia Pacific.

Crystal Violet (C.I. 42555) is Basic Violet 3 ($\lambda_{max}$=588 nm).

DBU represents 1,8-diazabicyclo[5,4,0]undec-7-ene (98%).

DHBA represents 2,4-dihydroxybenzoic acid.

Dioxalane is 1,3-dioxalane.

DMABA represents 4-(dimethylamino)benzoic acid.

DMSO represents dimethylsulfoxide.

t-BuOK represents potassium t-butoxide.

Poval 103 is a 98% hydrolyzed poly(vinyl alcohol) (Mw=15,000) that was obtained from Kuraray Corp.

LB9900 is a resole resin that was obtained from Hexion AG.

Malachite Green is Basic Green 4.

MEK represents methyl ethyl ketone.

MSA represents methanesulfonic acid (99%).

NMP represents N-methyl pyrrolidone.

Polyfox® PF 652 is a surfactant (Omnova).

PM represents 1-methoxy-2-propanol, can be obtained as Arcosolve® PM from LyondellBasell Industries (the Netherlands).

RX-04 is a poly(styrene-co-maleic anhydride) resin S0094 is an infrared radiation absorbing dye ($\lambda_{max}$=813 nm) that was obtained from FEW Chemicals (France).

Salicylsalicylic acid was obtained from Acros Organics (Geel, BE).

Sudan Black B is a neutral diazo dye (C.U. 26150).

RAR 62 represents a copolymer derived from acylolyamide, acrylonitrile, and phenyl maleimide.

TEA represents triethanolamine.

TMOF represents trimethyl orthoformate.

Victoria Blue R is a triarylmethane dye (Basic Blue 11, C.I. 44040).

Preparation of 4-Phthalimido Salicylic Acid Methyl Ester (Compound I):

Compound I

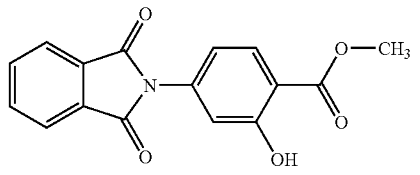

200 Grams of methyl ester of 4-aminosalicylic acid and 183 g of phthalic anhydride were charged to a 2 liter round bottom glass vessel equipped with a mechanical stirrer. Then 1.0 kg of acetic acid was charged to the reaction vessel. The mixture was heated to the reflux under stirring for 6 hours. Then the heating was turned off and the reaction mixture was chilled to room temperature. The precipitated product was filtered off, washed on the filter with water and alcohol, and dried. The yield of the Compound I was 90%. m.p. 218-219° C.

Preparation of Polymer A:

BF-03 (50 g) was dissolved in 800 g of DMSO at an elevated temperature (80-90° C.) in a round bottom reaction vessel equipped with a distillation column, mechanical stirrer and thermometer. Then to this solution, 99 g of Compound I in 250 g of DMSO were added (at 70-80° C.), and when Compound I was dissolved, 19 g of t-BuOK were added to the reaction mixture under stirring. Vacuum was applied and the trans-esterification reaction proceeded under vacuum (evacuation of the produced t-butanol and methanol) at 70-80° C. for 20-24 hours. The reaction mixture was then chilled to room temperature and neutralized with 23 g of methanesulfonic acid. For the acetalization, the dimethylacetal of salicylic aldehyde in methanol was used (the acetal was produced by mixing of 30.6 g of salicylic aldehyde with TMOF at 29.3 g in 50 g of methanol in the presence of a small amount of acidic catalyst—1.5 g of methanesulfonic acid). The acetal was added to the reaction mixture at 50° C. and methanol was distilled out in vacuum. After the distillation, the reaction mixture was neutralized with TEA to pH 6-7 and then precipitated into 10 volumes of water. The precipitated polymer was filtered off, washed with water, a water:ethanol mixture, and finally with ethanol. The polymer was dried in vacuum for 24 hours at 60° C. The yield was approximately 145 g [k=27 mol %; l=32 mol % according to the $^1$H NMR. The $^1$H NMR spectrum of polymer A (and internal standards) in DMSO-$d_6$ is shown in FIG. 1)].

Preparation of Polymer B:

Polymer B was prepared as described for making Polymer A, but 115.5 g of Compound I and 34.5 g of salicycylic aldehyde were used. The yield was about 156 g (k=25 mol %, l=36 mol % according to $^1$H NMR)

Preparation of Polymer C:

Polymer C was prepared as described for making Polymer A, but 83 g of Compound I and 41.8 g of salicyclic aldehyde were used. The yield was about 148.5 g (k=35 mol %, l=27 mol % according to $^1$H NMR)

Preparation of Polymer D:

Polymer D was prepared as described for making Polymer A, but instead of addition of the dimethyl acetal of the salicylic aldehyde in methanol, 3.95 g of 2-formylbenzoic acid and 32.6 g of salicylic aldehyde were added to the reaction mixture following by addition of 100 g of anisole, and the water:anisole azeothrope was distilled out. Polymer D was separated as carried out for Polymer A. The yield was approximately 146 g (k=23 mol %; l=32 mol %, o=6 mol % according to the $^1$H NMR).

Preparation of Polymer E:

Polymer E was prepared as described for making Polymer A, but instead of the addition of the dimethyl acetal of the salicylic aldehyde in methanol, 3.95 g of 4-carboxybenzaldehyde and 32.6 g of salicylic aldehyde were added to the reaction mixture following by addition of 100 g of anisole. The water:anisole azeothrope was distilled out. Polymer E was separated as carried out for Polymer A. The yield is about 145 g (k=23 mol %; l=32 mol %, o=5 mol % according to the $^1$H NMR).

Preparation of Polymer F:

Polymer F was prepared as described for making Polymer A, but instead of the addition of the dimethyl acetal of the salicylic aldehyde in methanol, 5 g of 2-formyphenoxyacetic acid and 32.6 g of salicylic aldehyde were added to the reaction mixture following by addition of 100 g of anisole. The water:anisole azeothrope was distilled out. Polymer F was separated as carried out for Polymer A. The yield was about 146 g (k=23 mol %; l=32 mol %, o=6 mol % according to the $^1$H NMR).

Preparation of Polymer G:

Poly(vinyl alcohol) (15.5 g, Kuraray Poval 103) was dissolved in 190 g of DMSO at elevated temperature (80-90° C.) in a 0.5 liter round bottom reaction vessel equipped with a distillation column, mechanical stirrer, and thermometer. After the dissolution of the PVA, the solution was chilled to 50° C. and 0.4 g of methanesulfonic acid diluted with 5 g of DMSO were added to the solution followed by addition of 3.5 g of TMOF diluted with 5 g of DMSO. Vacuum was applied in order to evacuate the methanol and methyl formate. During the distillation, the temperature in the reaction mixture increased to 80° C., the vacuum was dropped and to the reaction mixture were added 34.76 g of Compound I followed by the addition of 7.3 g of DBU diluted with 15 g of DMSO. Vacuum was then applied and the temperature in the reaction mixture was increased to 90-95° C. Very slight boiling of the reaction mixture was observed and the reaction mixture was stirred for an additional 5 to 6 hours at 90-95° C. The reaction mixture was chilled to 60° C., the vacuum is dropped, and 4.5 g of MSA diluted in 60 g of DMSO were added to the reaction mixture. Then, 8.16 g of salicylic aldehyde and 7.2 g of TMOF were added and diluted with 20 g of DMSO. The reaction mixture was stirred at 70-80° C. for an additional 2 hours and then it was chilled to 40° C. and 2.5 g of TEA diluted in 50 g of DMSA were added. The neutralized reaction mixture was chilled 25-30° C. and precipitated in 10 volumes of water. The resulting polymer is washed twice on the filter with deionized water, then with ethanol, and at last with water. The polymer was dried in a vacuum oven to provide a yield of 49 g (k=22 mol %: l=37 mol % according to the $^1$H NMR).

Preparation of Polymer H:

Polymer H was prepared as described for making Polymer G, but instead of performing the reaction in DMSO, a mixture of DMSO and BLO in a ratio of 1:1 (90 g of DMSO and 90 g of BLO) was used and all other reagents were added diluted in BLO (instead of being diluted in DMSO). The time for the transesterification reaction was 3 hours instead of 6 hours. The yield of Polymer H was 50.5 g. According to $^1$H NMR Polymer H has a similar structure to that of Polymer G.

Preparation of Polymer I:

10 g of Polymer H were dissolved in 70 g of 1,3-Dioxalane at room temperature. The solution was chilled to 15° C. and 2.7 g of p-tosylisocyanate diluted in 10 g of 1,3-dioxalane were slowly added to the reaction mixture. The reaction mixture was stirred for additional two hours at room temperature, and then the polymer was precipitated into 1 liter of deionized water. The precipitated polymer was filtered and washed with water and then with ethanol on the filter. The polymer was dried in vacuum oven at 60° C. overnight, providing a yield of 11.7 g of Polymer I (k=22 mol %, l=37 mol %, p=6 mol %, according to $^1$H NMR).

Preparation of Polymer J:

Polymer J was prepared as described for making Polymer H, but before the addition of TEA (for the neutralization of the MSA) to the chilled to room temperature reaction mixture 13.2 g of p-tosylisocyanate were slowly added to the reaction mixture and the mixture was stirred at room temperature for additional 2 hours. The polymer was precipitated into water, washed on the filter with water and alcohol, and dried in vacuum oven at 60° C. overnight. The yield was 56 g (k=22 mol %, l=37 mol %, p=9 mol %, according to $^1$H NMR).

Invention Example 1

An imageable element of the present invention was prepared in the following manner. A radiation-sensitive composition was prepared using the following components:

| | |
|---|---|
| Polymer A | 9.02 g |
| LB9900 (49% in PM) | 0.136 g |
| Malachite green oxalate | 0.024 g |
| S 0094 IR Dye | 0.030 g |
| Sudan Black B | 0.024 g |
| DHBA:Salicylsalicylic acid (1:1 weight ratio) | 0.196 g |
| Polyfox ® PF 652 (10% in PM) | 0.036 |
| BLO | 3.00 g |
| MEK | 4.50 g |
| PM | 7.32 g |

This composition was filtered and applied to an electrochemically roughened and anodized aluminum substrate that had been subjected to a treatment using an aqueous solution of sodium phosphate and sodium fluoride by means of common methods and the resulting imageable layer coating is dried for 30 seconds at 130° C. in Glunz&Jensen "Unigraph Quartz" oven. The dry coating weight of the imageable layer was about 1.5 g/m$^2$.

The resulting imageable element was conditioned with interleaving paper for 48 hours at 60° C. and 30% RH. It was then exposed on a Kodak® Lotem 400 Quantum imager in a range of energies 60 mJ/cm$^2$ to 180 mJ/cm$^2$ and developed for 30 seconds at 23° C. in a Glunz&Jensen "InterPlater 85HD" processor using a solution of 3% potassium hydroxide. After washing with water, the resulting printing plate was evaluated for sensitivity (Clearing Point: the lowest imaging energy at which the exposed regions were completely removed by the developer at a given temperature and time, Linearity Point: the energy at which the 50% dots at 200 lpi screen are reproduced as 50%±0.2% dots), Cyan Density Loss (CDL) in non-imaged (non-exposed) areas. The results are shown in TABLES I and II below.

Invention Example 2

Another imageable element of the present invention was prepared using the radiation-sensitive composition having the following components and following the procedure of Invention Example 1:

| | |
|---|---|
| Polymer B | 0.902 g |
| LB9900 (49% in PM) | 0.290 g |
| Crystal Violet | 0.019 g |
| S 0094 IR Dye | 0.030 g |
| Malachite green oxalate | 0.009 g |
| DHBA | 0.192 g |
| Sudan Black B | 0.024 g |
| Polyfox ® PF 652 (10% in PM) | 0.036 g |
| MEK | 4.54 g |
| PM | 5.11 g |
| BLO | 3.64 g |
| Dioxalane | 4.54 g |

The results that were obtained using this imageable element are shown below in TABLES I and II.

Invention Example 3

Another imageable element of the present invention was prepared using the radiation-sensitive composition having the following components and following the procedure of Invention Example 1:

| | |
|---|---|
| Polymer C | 0.848 g |
| LB9900 (49% in PM) | 0.193 g |
| Infrared Dye S0094 | 0.030 g |
| Crystal Violet | 0.024 g |
| Sudan Black B | 0.024 g |
| DHBA | 0.167 g |
| Polyfox ® PF 652 (10% in PM) | 0.036 g |
| MEK | 3.85 g |
| PM | 4.38 g |
| BLO | 3.08 g |
| Dioxalane | 3.85 g |

The results that were obtained using this imageable element are shown below in TABLES I and II.

Invention Example 4

Another imageable element of the present invention was prepared using the radiation-sensitive composition having the following components and following the procedure of Invention Example 1:

| | |
|---|---|
| Polymer D | 0.902 g |
| LB9900 (49% in PM) | 0.118 g |
| S 0094 IR Dye | 0.030 g |
| Sudan Black B | 0.012 g |
| Crystal Violet | 0.024 g |
| 2,4-Dihydroxybenzoic acid | 0.095 g |
| Polyfox ® PF 652 (10% in PM) | 0.036 g |
| BLO | 2.73 g |
| Dioxalane | 3.42 g |
| PM | 3.94 g |
| MEK | 3.42 g |

The results that were obtained using this imageable element are shown below in TABLES I and II.

Invention Example 5

Another imageable element of the present invention was prepared using the radiation-sensitive composition having the following components and following the procedure of Invention Example 1:

| | |
|---|---|
| Polymer E | 0.902 g |
| LB9900 (49% in PM) | 0.122 g |
| S 0094 IR Dye | 0.030 g |
| Crystal Violet | 0.024 g |
| Sudan Black B | 0.013 g |
| 2,4-Dihydroxybenzoic acid | 0.165 g |
| Polyfox ® PF 652 (10% in PM) | 0.036 g |
| BLO | 2.93 g |
| Dioxalane | 3.66 g |
| PM | 4.22 g |
| MEK | 3.66 g |

The results that were obtained using this imageable element are shown below in TABLES I and II.

Invention Example 6

Another imageable element of the present invention was prepared using the radiation-sensitive composition having the following components and following the procedure of Invention Example 1:

| | |
|---|---|
| Polymer F | 0.902 g |
| LB9900 (49% in PM) | 0.122 g |
| S 0094 IR Dye | 0.030 g |
| Crystal Violet | 0.024 g |
| Sudan Black B | 0.012 g |
| ABA | 0.136 g |
| Polyfox ® PF 652 (10% in PM) | 0.036 g |
| BLO | 2.85 g |
| Dioxalane | 3.56 g |
| PM | 4.11 g |
| MEK | 3.56 g |

The results that were obtained using this imageable element are shown below in TABLES I and II.

Invention Example 7

Another imageable element of the present invention was prepared using the radiation-sensitive composition having the following components and following the procedure of Invention Example 1:

| | |
|---|---|
| Polymer B | 0.902 g |
| BPA (23% in PM) | 0.163 g |
| RX04 | 0.041 g |
| S 0094 IR Dye | 0.030 g |
| Victoria Blue R | 0.014 g |
| Sudan Black B | 0.027 g |
| ABA | 0.177 g |
| Polyfox ® PF 652 (10% in PM) | 0.036 g |
| BLO | 3.36 g |
| Dioxalane | 4.20 g |
| PM | 4.47 g |
| MEK | 3.36 g |

The results that were obtained using this imageable element are shown below in TABLES I and II.

Invention Example 8

Another imageable element of the present invention was prepared using the radiation-sensitive composition having the following components and following the procedure of Invention Example 1:

| | |
|---|---|
| Polymer G | 0.902 g |
| BPA (23% in PM) | 0.163 g |
| RX04 | 0.041 g |
| S 0094 IR Dye | 0.030 g |
| Victoria Blue R | 0.014 g |
| Sudan Black B | 0.027 g |
| ABA | 0.177 g |
| Polyfox ® PF 652 (10% in PM) | 0.036 g |
| BLO | 3.36 g |
| Dioxalane | 4.20 g |
| PM | 4.47 g |
| MEK | 4.20 g |

The results that were obtained using this imageable element are shown below in TABLES I and II.

Invention Example 9

Another imageable element was prepared as in Invention Example 1, but this time using the following coating solution and were not conditioned with interleave paper for two days at 60° C. at RH of 29%.

| | |
|---|---|
| Polymer G | 0.902 g |
| BPA (23% in PM) | 0.078 g |
| RX04 | 0.078 g |
| S 0094 IR Dye | 0.030 g |
| Victoria Blue R | 0.014 g |
| Sudan Black B | 0.027 g |
| ABA | 0.177 g |
| Polyfox ® PF 652 (10% in PM) | 0.036 g |
| BLO | 3.19 g |
| Dioxalane | 3.99 g |
| PM | 4.50 g |
| MEK | 3.99 g |

The results that were obtained using this imageable element are shown below in TABLES I and II.

Invention Example 10

Another imageable element of the present invention was prepared using the radiation-sensitive composition having the following components and following the procedure of Invention Example 1:

| | |
|---|---|
| Polymer G | 0.902 g |
| THPE | 0.071 g |
| RX04 | 0.078 g |
| S 0094 IR Dye | 0.030 g |
| Victoria Blue R | 0.014 g |
| Sudan Black B | 0.027 g |
| ABA | 0.177 g |
| Polyfox® PF 652 (10% in PM) | 0.036 g |
| BLO | 3.19 g |
| Dioxalane | 3.99 g |
| PM | 4.50 g |
| MEK | 3.99 g |

Invention Example 11

Another imageable element of the present invention was prepared using the radiation-sensitive composition having the following components and following the procedure of Invention Example 1:

| | |
|---|---|
| Polymer H | 0.802 g |
| RAR 62 | 0.348 g |
| S 0094 IR Dye | 0.030 g |
| Victoria Blue R | 0.014 g |
| Sudan Black B | 0.027 g |
| ABA | 0.177 g |
| Polyfox® PF 652 (10% in PM) | 0.036 g |
| BLO | 3.19 g |
| Dioxalane | 3.99 g |
| PM | 4.50 g |
| MEK | 3.99 g |

Invention Example 12

Another imageable element of the present invention was prepared using the radiation-sensitive composition having the following components and following the procedure of Invention Example 1:

| | |
|---|---|
| Polymer I | 0.762 g |
| BPA1100 | 0.12 g |
| S 0094 IR Dye | 0.026 g |
| Victoria Blue R | 0.011 g |
| Sudan Black B | 0.021 g |
| ABA | 0.11 g |
| Polyfox(R) PF 652 (10% in PM) | 0.031 g |
| BLO | 2.69 g |
| Dioxalane | 3.24 g |
| PM | 3.50 g |
| MEK | 3.24 g |

Invention Example 13

Another imageable element of the present invention was prepared using the radiation-sensitive composition having the following components and following the procedure of Invention Example 1:

| | |
|---|---|
| Polymer J | 0.79 g |
| BPA1100 | 0.12 g |
| S 0094 IR Dye | 0.026 g |
| Victoria Blue R | 0.011 g |
| Sudan Black B | 0.021 g |
| ABA | 0.081 g |
| Polyfox(R) PF 652 (10% in PM) | 0.031 g |
| BLO | 2.69 g |
| Dioxalane | 3.24 g |
| PM | 3.50 g |
| MEK | 3.24 g |

The results that were obtained using this imageable element are shown below in TABLES I and II.

Comparative Examples 1-3

Three comparative positive-working printing plate precursors were compared to the imageable elements of the present invention. Comparative Example 1 used the commercial element, Kodak SWORD ULTRA Thermal Printing Plate that is available from Eastman Kodak Company, and Comparative Example 2 used the commercial element, Fuji Photo's LH-PJE printing plate. The Kodak Sword Ultra Thermal Printing Plate comprises an imageable layer that contains a predominant polymeric binder that is outside the scope of the present invention. Fuji Photo's LH-PJE printing plate has a single imageable layer that is also outside the scope of the present invention.

Comparative Example 3 was prepared according to Invention Example 4 of copending and commonly assigned U.S. Ser. No. 12/339,469 (Levanon, Bylina, Kampel, Postel, Rubin, and Kurtser) (thus, the Polymer G described for Comparative Example 3 is not the same as Polymer G described above for this invention). A radiation-sensitive composition was prepared using the following components:

| | |
|---|---|
| Polymer G | 10.02 g |
| S 0094 IR Dye | 0.34 g |
| Sudan Black B | 0.14 g |
| Crystal Violet | 0.27 g |
| 2,4-Dihydroxybenzoic acid | 2 g |
| NMP | 70 g |
| PM | 86 g |

TABLE I

| EXAMPLE | POLYMER BINDER | CDL % | Clearing Point (mJ/cm$^2$) | Linearity Point (mJ/cm$^2$) |
|---|---|---|---|---|
| Invention Example 1 | A | 10.8 | 65 | 102 |
| Invention Example 2* | B | 6.8 | 60 | 125 |
| Invention Example 3 | C | 5.3 | 80 | 155 |
| Invention Example 4 | D | 10 | 150 | 160 |
| Invention Example 5 | E | 2.6 | 70 | 125 |
| Invention Example 6 | F | 1.9 | 55 | 140 |
| Invention Example 7 | B | 1.6 | <50 | 85 |
| Invention Example 8 | G | 1.7 | 50 | 95 |
| Invention Example 9 | G | 3.7 | 50 | 108 |
| Invention Example 10 | G | 3.6 | 50 | 96 |
| Invention Example 11 | H | 5 | 70 | 98 |
| Invention Example 12 | I | 0.7 | 60 | 110 |
| Invention Example 13 | J | 0.7 | 70 | 90 |

*in Goldstar Premium

The results shown in TABLE I show that the imageable elements prepared according to this invention containing a poly(vinyl acetal-co-hydroxyaryl ester) binder in the imageable layer within the scope of this invention demonstrated excellent imaging speed and low weight loss in the not imaged areas for both conditioned and not conditioned printing plate precursors.

The imageable elements of Invention Examples 1-13 and Comparative Examples 1-3 were evaluated using the following tests:

Resistance to UV Wash Test 1: Drops of the Vam UV Wash were placed on the imaged and developed printing plates at 10 minute intervals up to 20 minutes, and then the drops were removed with a cloth. The amount of removed printing layer was estimated.

Resistance to UV Wash Test 2: Drops of a mixture of diacetone alcohol (DAA) and water at a ratio of 4:1 were placed on the imaged and developed printing plates at 10 minute intervals up to 20 minutes, and then the drops were removed with a cloth. The amount of removed printing layer was estimated.

Resistance to Alcohol-Sub Fountain Solution: Drops of a mixture of 2-butoxyethanol (BC) and water at a ratio of 4:1 were placed on the imaged and developed printing plates at 10 minute intervals up to 20 minutes, and then the drops were removed with a cloth. The amount of removed printing layer was estimated.

The results of these tests are shown in the following TABLE II. The results show that the compositions containing the primary binder poly(vinyl acetal-co-hydroxyaryl ester) copolymers containing cyclic imide moieties within the scope of this invention provided imageable elements with excellent solvent resistance to a broad range of press chemicals.

The invention has been described in detail with particular reference to certain preferred embodiments thereof, but it will be understood that variations and modifications can be effected within the spirit and scope of the invention.

TABLE II

| EXAMPLE | POLYMER | SOLVENT RESISTANCE* | | | | | |
|---|---|---|---|---|---|---|---|
| | | Resistance to Alcohol-Fountain Solution | | Resistance to UV Wash | | | |
| | | $BC:H_2O$ (4:1) | | $DAA:H_20$ (4:1) | | UV Wash (Varn) | |
| | | 10 min | 20 min | 10 min | 20 min | 10 min | 20 min |
| Invention Example 1 | A | 0 | 0 | 0 | 9 | 0 | 6 |
| Invention Example 2 | B | 6.2 | 7.8 | 17 | 40 | 7.2 | 14.4 |
| Invention Example 3 | C | 0 | 0 | 6.5 | 15 | 5.8 | 8.8 |
| Invention Example 4 | D | 0 | 0 | 2.8 | | 0 | |
| Invention Example 5 | E | 0 | 3 | | 27 | 0 | 0 |
| Invention Example 6 | F | 0.2 | 0.6 | 4.7 | 50 | 4.8 | 5.2 |
| Invention Example 7 | B | 0 | 0 | 0 | 3.2 | | 15.5 |
| Invention Example 8 | G | 0 | 0 | 0 | 1.5 | 0 | 2.6 |
| Invention Example 9 | G | 0 | 0 | 0 | 10 | 0 | 7.5 |
| Invention Example 10 | G | 0 | 0 | 0 | 10 | 2 | 11 |
| Invention Example 11 | H | 0 | 0 | 0 | 2 | 0 | 0 |
| Invention Example 12 | I | 0 | 0 | 0 | 5 | 0 | 0 |
| Invention Example 13 | J | 0 | 0 | 0 | 2 | 0 | 0 |
| Comparative Example 1 | | 19 | 26 | 38 | 49 | 19 | 25 |
| Comparative Example 2 | | 1 | | 70 | ** | 1.2 | |
| Comparative Example 3 | | 0 | 6 | 3 | ** | 2 | 15 |

*Applied at 23° C.

** Coating dissolved or almost dissolved

The invention claimed is:

1. A positive-working imageable element comprising a substrate having thereon an imageable layer comprising a water-insoluble polymeric binder, and a radiation absorbing compound, wherein the polymeric binder comprises:

a) vinyl acetal recurring units comprising pendant hydroxyaryl groups, and b) recurring units comprising hydroxyaryl ester groups that are substituted with a cyclic imide group, wherein the vinyl acetal recurring units comprising pendant hydroxyaryl groups and the recurring units comprising hydroxyaryl ester groups that are substituted with a cyclic imide group are independently present in the polymeric binder in an amount of at least 10 mol % and 25 mol %, respectively, all based on the total recurring units in the polymeric binder.

2. The element of claim 1 wherein the polymeric binder comprises recurring units represented by each of the following Structures (Ia) and (Ib):

(Ia)

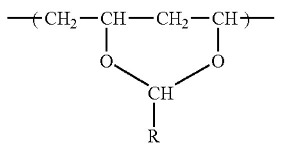

(Ib)

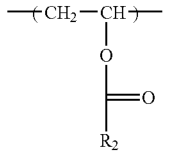

wherein the recurring units of Structure (Ia) are present at from about 10 to about 35 mol %, the recurring units of Structure (Ib) are present at from about 25 to about 60 mol %, all based on total recurring units in the polymeric binder, R is a substituted or unsubstituted hydroxyaryl group, and $R_2$ is a substituted or unsubstituted hydroxyaryl group that is substituted with a cyclic imide group.

3. The element of claim 2 wherein R is a substituted or unsubstituted hydroxyphenyl group and $R_2$ is a hydroxyphenyl group that is substituted with a cyclic imide group.

4. The element of claim 2 wherein the polymeric binder further comprises from about 25 to about 60 mol % of recurring units represented by the following Structure (Ic):

(Ic)

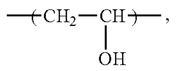

and optionally up to 25 mol % of recurring units represented by the following Structure (Id), optionally up to 10 mol % of recurring units represented by the following Structure (Ie), and optionally up to 20 mol % of recurring units represented by the following Structure (If), all based on the total recurring units in the polymeric binder:

(Id)

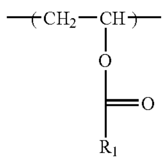

(Ie)

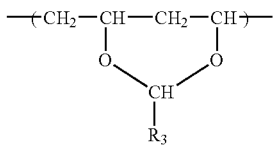

-continued (If)

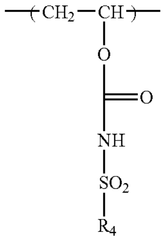

wherein $R_1$ is a substituted or unsubstituted alkyl, substituted or unsubstituted cycloalkyl, or substituted or unsubstituted aryl group, $R_3$ is an aryl group that is substituted with an $—O_x—(CH_2)_y—COOH$ group wherein x is 0 or 1 and y is 0, 1, or 2, and $R_4$ is a substituted or unsubstituted aryl group.

5. The element of claim 2 wherein the recurring units represented by Structure (Ia) are present at from about 15 to about 25 mol %, and the recurring units represented by Structure (Ib) are present at from about 25 to about 45 mol %, all based on the total recurring units in the polymeric binder.

6. The element of claim 1 wherein the polymeric binder comprises recurring units represented by each of Structures (Ia) through (If):

(Ia)

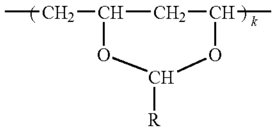

(Ib)

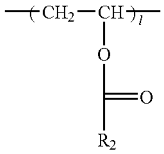

(Ic)

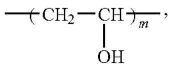

(Id)

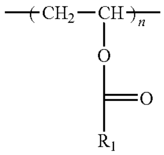

(Ie)

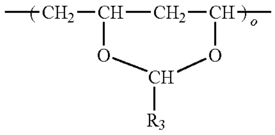

-continued (If)

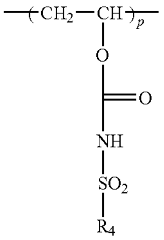

wherein R is a substituted or unsubstituted hydroxyphenyl group, $R_1$ is a substituted or unsubstituted alkyl, substituted or unsubstituted cycloalkyl, or substituted or unsubstituted aryl group, $R_2$ is a hydroxyphenyl group that is substituted with a cyclic imide group, $R_3$ is an aryl group that is substituted with an $—O_x—(CH_2)_y—COOH$ group wherein x is 0 or 1 and y is 0, 1, or 2, $R_4$ is a substituted or unsubstituted aryl group, k is from about 15 to about 25 mol %, 1 is from about 25 to about 45 mol %, m is from about 30 to about 55 mol %, n is from 0 to about 15 mol %, o is from 0 to about 8 mol %, and p is from 0 to about 10 mol %, all based on the total recurring units in the polymeric binder.

7. The element of claim 1 wherein the polymeric binder is present at from about 40 to about 95 weight % based on the total dry weight of the imageable layer, and the radiation absorbing compound is an infrared radiation absorbing compound that is present at from about 0.1 to about 30 weight %, based on the total dry weight of the layer in which it is located.

8. The element of claim 1 further comprising a colorant dye or a UV- or visible-light sensitive component, or both, in the imageable layer.

9. The element of claim 1 further comprising a developability enhancing compound.

10. The element of claim 1 wherein the polymeric binder comprises recurring units represented by each of Structures (Ia) through (Id):

(Ia)

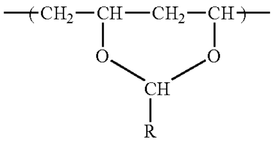

(Ib)

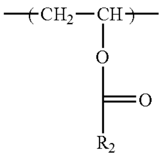

(Ic)

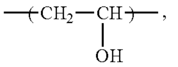

(Id)

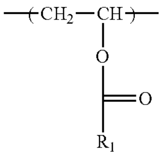

wherein R is a substituted or unsubstituted hydroxyphenyl group, $R_1$ is a substituted or unsubstituted alkyl, substituted or unsubstituted cycloalkyl, or substituted or unsubstituted aryl group, and $R_2$ is a hydroxyphenyl group that is substituted with a cyclic imide group.

11. The element of claim 1 wherein the polymeric binder comprises recurring units represented by each of Structures (Ia) through (Ie):

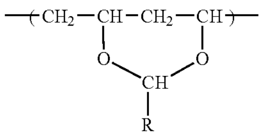
(Ia)

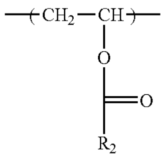
(Ib)

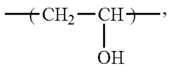
(Ic)

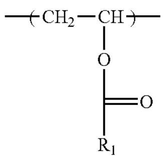
(Id)

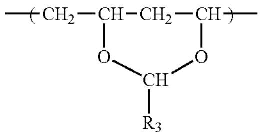
(Ie)

wherein R is a substituted or unsubstituted hydroxyphenyl group, $R_1$ is a substituted or unsubstituted alkyl, substituted or unsubstituted cycloalkyl, or substituted or unsubstituted aryl group, $R_2$ is a hydroxyphenyl group that is substituted with a cyclic imide group, and $R_3$ is an aryl group that is substituted with an $—O_x—(CH_2)_y—COOH$ group wherein x is 0 or 1 and y is 0, 1, or 2.

12. The element of claim 1 wherein the polymeric binder comprises recurring units represented by each of Structures (Ia) through (If):

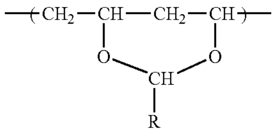
(Ia)

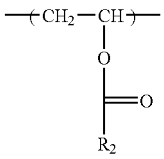
(Ib)

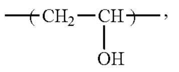
(Ic)

-continued

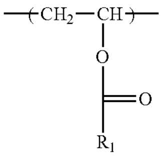
(Id)

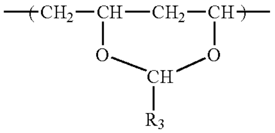
(Ie)

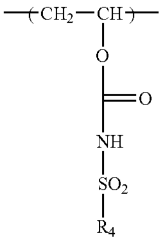
(If)

wherein R is a substituted or unsubstituted hydroxyphenyl group, $R_1$ is a substituted or unsubstituted alkyl, substituted or unsubstituted cycloalkyl, or substituted or unsubstituted aryl group, $R_2$ is a hydroxyphenyl group that is substituted with a cyclic imide group, $R_3$ is an aryl group that is substituted with an $—O_x—(CH_2)_y—COOH$ group wherein x is 0 or 1 and y is 0, 1, or 2, and $R_4$ is a substituted or unsubstituted aryl group.

13. A method of making an imaged element comprising:

A) imagewise exposing the positive-working imageable element of claim 1 to provide exposed and non-exposed regions, and B) developing the imagewise exposed element to remove predominantly only the exposed regions.

14. The method of claim 13 wherein the imageable element is imaged at a wavelength of from about 750 to about 1250 nm to provide a lithographic printing plate having a hydrophilic aluminum-containing substrate.

15. The method of claim 13 wherein the polymeric binder in the imageable element comprises recurring units represented by each of the following Structures (Ia) and (Ib):

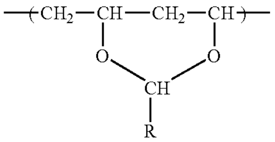
(Ia)

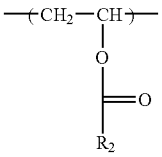
(Ib)

wherein the recurring units of Structure (Ia) are present at from about 10 to about 35 mol %, the recurring units of Structure (Ib) are present at from about 25 to about 60 mol %, all based on the total recurring units in the polymeric binder, R is a hydroxyaryl group, $R_2$ is a hydroxyaryl group that is substituted with a cyclic imide group.

16. The method of claim 15 wherein R is a substituted or unsubstituted hydroxyphenyl group and $R_2$ is hydroxyphenyl group that is substituted with a cyclic imide group.

17. The method of claim 15 wherein the polymeric binder further comprises from about 25 to about 60 mol % of recurring units represented by the following Structure (Ic):

(Ic)

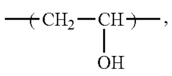

and optionally up to 25 mol % of recurring units represented by the following Structure (Id), optionally up to 10 mol % of recurring units represented by the following Structure (Ie), and optionally up to 20 mol % of recurring units represented by the following Structure (If), all based on the total recurring units in the polymeric binder:

(Id)

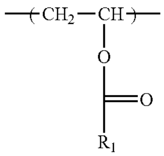

(Ie)

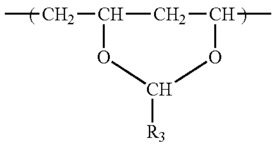

(If)

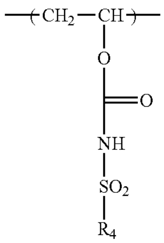

wherein $R_1$ is a substituted or unsubstituted alkyl, substituted or unsubstituted cycloalkyl, or substituted or unsubstituted aryl group, $R_3$ is an aryl group that is substituted with an $-O_x-(CH_2)_y-COOH$ group wherein x is 0 or 1 and y is 0, 1, or 2, and $R_4$ is a substituted or unsubstituted aryl group.

18. The method of claim 15 wherein the recurring units represented by Structure (Ia) are present at from about 15 to about 25 mol %, and the recurring units represented by Structure (Ib) are present at from about 25 to about 45 mol %, all based on the total recurring units in the polymeric binder.

19. The method of claim 15 wherein the polymeric binder comprises recurring units represented by each of Structures (Ia) through (If):

(Ia)

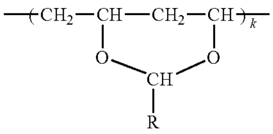

(Ib)

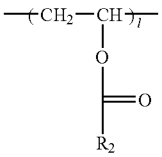

(Ic)

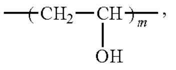

(Id)

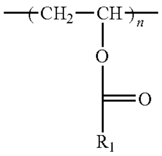

(Ie)

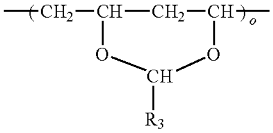

(If)

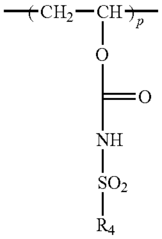

wherein R is a substituted or unsubstituted hydroxyphenyl group, $R_1$ is a substituted or unsubstituted alkyl, substituted or unsubstituted cycloalkyl, or substituted or unsubstituted aryl group, $R_2$ is or hydroxyphenyl group that is substituted with a cyclic imide group, $R_3$ is an aryl group that is substituted with an $-O_x-(CH_2)_y-$ COOH group wherein x is 0 or 1 and y is 0, 1, or 2, $R_4$ is a substituted or unsubstituted aryl group, k is from about 15 to about 25 mol %, 1 is from about 25 to about 45 mol %, m is from about 30 to about 55 mol %, n is from 0 to about 15 mol %, o is from 0 to about 8 mol %, and p is from 0 to about 10 mol %, all based on the total recurring units in the polymeric binder.

* * * * *